(12) United States Patent  (10) Patent No.: US 8,344,815 B2
Yamanaka  (45) Date of Patent: Jan. 1, 2013

(54) SURFACE ACOUSTIC WAVE RESONATOR, SURFACE ACOUSTIC WAVE OSCILLATOR, AND SURFACE ACOUSTIC WAVE MODULE UNIT

(75) Inventor: Kunihito Yamanaka, Kamiina-gun (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/125,239

(22) PCT Filed: Oct. 22, 2009

(86) PCT No.: PCT/JP2009/005541
§ 371 (c)(1),
(2), (4) Date: Apr. 20, 2011

(87) PCT Pub. No.: WO2010/047114
PCT Pub. Date: Apr. 29, 2010

(65) Prior Publication Data
US 2011/0199163 A1  Aug. 18, 2011

(30) Foreign Application Priority Data

Oct. 24, 2008 (JP) .................................. 2008-273973

(51) Int. Cl.
*H01L 41/04* (2006.01)
*H03H 9/64* (2006.01)
*H03B 5/30* (2006.01)

(52) U.S. Cl. ...................... 331/154; 310/313 B; 333/196

(58) Field of Classification Search .................. 331/154, 331/107 A; 310/313 B, 313 A; 333/196
See application file for complete search history.

(56) References Cited

U.S. PATENT DOCUMENTS

| 5,256,927 | A | * | 10/1993 | Kato et al. ................. 310/313 B |
| 6,420,946 | B1 | | 7/2002 | Bauer et al. |
| 7,002,438 | B2 | | 2/2006 | Kawachi et al. |
| 7,042,132 | B2 | | 5/2006 | Bauer et al. |

FOREIGN PATENT DOCUMENTS

| JP | A-61-220515 | 9/1986 |
| JP | A-63-135010 | 6/1988 |
| JP | A-3-139008 | 6/1991 |
| JP | A-10-335966 | 12/1998 |
| JP | B2-3310132 | 7/2002 |
| JP | A-2003-258595 | 9/2003 |
| JP | A-2004-363641 | 12/2004 |
| JP | A-2005-86223 | 3/2005 |
| JP | A-2005-204042 | 7/2005 |
| JP | A-2006-67211 | 3/2006 |
| JP | B2-4017984 | 12/2007 |

OTHER PUBLICATIONS

International Search Report mailed on Dec. 8, 2009 issued in International Patent Application No. PCT/JP2009/005541.

* cited by examiner

*Primary Examiner* — Joseph Chang
(74) *Attorney, Agent, or Firm* — Oliff & Berridge, PLC

(57) ABSTRACT

In a surface acoustic wave resonator in which an IDT having electrode fingers for exciting surface acoustic waves is formed on a crystal substrate, the line occupying ratio causing the maximum electromechanical coupling coefficient and the line occupying ratio causing the maximum reflection of the surface acoustic waves in the IDT are different from each other, the center of the IDT has the line occupying ratio causing an increase in electromechanical coupling coefficient in comparison with the edges of the IDT, and the edges of the IDT have the line occupying ratio causing an increase in reflection of the surface acoustic waves in comparison with the center of the IDT.

14 Claims, 11 Drawing Sheets

SURFACE ACOUSTIC WAVE RESONATOR, SURFACE ACOUSTIC WAVE OSCILLATOR, AND SURFACE ACOUSTIC WAVE MODULE UNIT

TECHNICAL FIELD

The present invention relates to a surface acoustic wave resonator employing a piezoelectric substrate, a surface acoustic wave oscillator, and a surface acoustic wave module unit.

BACKGROUND ART

Conventionally, surface acoustic wave resonators using surface acoustic waves (SAW) have been widely used in electronic apparatuses.

With the recent spread of portable devices, a decrease in the size of a surface acoustic wave resonator used therein has been required. With the decrease in the size of the surface acoustic wave resonator, there is a problem in that a decrease in Q value or an increase in CI value is caused and thus the characteristics of the surface acoustic wave resonator cannot be satisfactorily obtained.

As a countermeasure, for example, PTL 1 discloses a technique of enhancing the Q value by reducing a line width ratio (a line occupying ratio) which is a ratio of an electrode finger width to an electrode finger pitch in a comb-like electrode from the center of the comb-like electrode to both edges thereof.

Citation List

Patent Literature

[PTL 1] JP-A-63-135010

SUMMARY OF INVENTION

Technical Problem

However, in the configuration of the surface acoustic wave resonator described in PTL 1, the reflection of surface acoustic waves at the edges of an IDT increases but the frequency at the edges of the IDT increases more than that at the center of the IDT. Accordingly, the confinement of energy of the surface acoustic waves in the IDT deteriorates and the increase in Q value is not satisfactory.

Solution to Problem

The invention is made to solve at least a part of the above-mentioned problems and can be embodied by the following aspects or applications.

(Application 1) There is provided a surface acoustic wave resonator in which an IDT including electrode fingers for exciting surface acoustic waves is disposed on a piezoelectric substrate, wherein a line occupying ratio is defined as a value obtained by dividing the width of one electrode finger of the electrode fingers by the distance between a center line of a gap between the one electrode finger and the electrode finger adjacent to one side thereof and a center line of a gap between the one electrode finger and the electrode finger adjacent to the other side thereof, the line occupying ratio causing the maximum electromechanical coupling coefficient and the line occupying ratio causing the maximum reflection of the surface acoustic waves in the IDT are different from each other, the center of the IDT has the line occupying ratio causing an increase in electromechanical coupling coefficient in comparison with the edges of the IDT, and the edges of the IDT have the line occupying ratio causing an increase in reflection of the surface acoustic waves in comparison with the center of the IDT.

According to this configuration, in the IDT in which the line occupying ratio causing the maximum electromechanical coupling coefficient and the line occupying ratio causing the maximum reflection of surface acoustic waves are different from each other, the line occupying ratio is weighted. The line occupying ratio causing an increase of electromechanical coupling coefficient in comparison with the edges of the IDT is set at the center of the IDT, and the line occupying ratio causing an increase in reflection of surface acoustic waves in comparison with the center of the IDT is set at the edges of the IDT.

Regarding the standing waves of the surface acoustic waves generated in the surface acoustic wave resonator, the vibration displacement is large at the center of the IDT and is small at both edges thereof. The line occupying ratio causing the increase in electromechanical coupling coefficient is selected for the center having the large vibration displacement so as to suppress an increase in CI value, and the line occupying ratio causing the increase in reflection of the surface acoustic waves is selected for the edges having the small vibration displacement so as to enhance the confinement of vibration energy in the IDT. Accordingly, it is possible to implement a surface acoustic wave resonator with excellent CI value and Q value.

Accordingly, it is possible to provide a surface acoustic wave resonator in which the size is reduced by increasing the Q value and the power consumption is reduced by decreasing the CI value.

(Application 2) In the surface acoustic wave resonator, the line occupying ratio may be gradually changed from the center of the IDT to the edges of the IDT.

According to this configuration, since the line occupying ratio is gradually changed from the center of the IDT to the edges of the IDT, the line occupying ratio does not rapidly change between the neighboring electrode fingers. Accordingly, a part of the surface acoustic waves is not converted into bulk waves and the like in mode and the vibration displacement is kept great at the center of the IDT, thereby maintaining an excellent Q value.

(Application 3) In the surface acoustic wave resonator, the piezoelectric substrate may be a crystal substrate with an Euler angle ($-1°$ to $+1°$, $113°$ to $135°$, $\pm(40°$ to $49°)$), the line occupying ratio $\eta c$ at the center of the IDT may be in the range of $0.3 \leq \eta \leq 0.5$, and the line occupying ratio $\eta e$ at the edges of the IDT may be in the range of $0.15 \leq \eta e \leq 0.3$.

According to this configuration, since the line occupying ratio $\eta c$ at the center of the IDT is set to the range of $0.3 \leq \eta c \leq 0.5$ and the line occupying ratio $\eta e$ at the edges of the IDT is set to the range of $0.15 \leq \eta e \leq 0.3$ by using the crystal substrate as the piezoelectric substrate, it is possible to implement a surface acoustic wave resonator having an excellent frequency-temperature characteristic and excellent CI value and Q value.

(Application 4) In the surface acoustic wave resonator, a ratio $\eta e/\eta c$ of the line occupying ratio $\eta e$ at the edges of the IDT to the line occupying ratio $\eta c$ at the center of the IDT may be in the range of $0.34 < \eta e/\eta c < 1.0$.

When the ratio $\eta e/\eta c$ of the line occupying ratio $\eta e$ at the edges of the IDT to the line occupying ratio $\eta c$ at the center of the IDT is set to the range of $0.34 < \eta e/\eta c < 1.0$, it is possible to obtain a surface acoustic wave resonator having an enhanced Q value in comparison with the conventional surface acoustic wave resonator.

(Application 5) In the surface acoustic wave resonator, the ratio $\eta e/\eta c$ of the line occupying ratio $\eta e$ at the edge of the IDT to the line occupying ratio $\eta c$ at the center of the IDT may be in the range of $0.46 \leq \eta e/\eta c \leq 0.8$.

When the ratio ηe/ηc of the line occupying ratio ηe at the edges of the IDT to the line occupying ratio ηc at the center of the IDT is set to the range of 0.46≦ηe/ηc≦0.8, it is possible to obtain a surface acoustic wave resonator having a further enhanced Q value in comparison with the conventional surface acoustic wave resonator.

(Application 6) In the surface acoustic wave resonator, an electrode finger pitch which is the distance between the centers of the neighboring electrode fingers in the IDT may gradually increase from the center of the IDT to both edges thereof.

According to this configuration, the electrode finger pitch in addition to the line occupying ratio gradually increases from the center of the IDT to both edges thereof.

In this way, by setting the electrode finger pitch to increase from the center of the IDT to the edges thereof, it is possible to lower the frequency at the edges of the IDT and to enhance the confinement of vibration energy. Accordingly, it is possible to implement a surface acoustic wave resonator having an excellent Q value.

(Application 7) In the surface acoustic wave resonator, a ratio PTs/PT of the electrode finger pitch PTs at the edges of the IDT to the electrode finger pitch PT at the center of the IDT may be in the range of 1<PTs/PT<1.0355.

According to this configuration, when the ratio PTs/PT of the electrode finger pitch PTs at the edges of the IDT to the electrode finger pitch PT at the center of the IDT is set to the range of 1<PTs/PT<1.0355, it is possible to obtain a surface acoustic wave resonator having an enhanced Q value in comparison with the conventional surface acoustic wave resonator.

(Application 8) In the surface acoustic wave resonator, the ratio PTs/PT of the electrode finger pitch PTs at the edges of the IDT to the electrode finger pitch PT at the center of the IDT may be in the range of 1.004≦PTs/PT≦1.0315.

According to this configuration, when the ratio PTs/PT of the electrode finger pitch PTs at the edges of the IDT to the electrode finger pitch PT at the center of the IDT is set to the range of 1.004≦PTs/PT≦1.0315, it is possible to obtain a surface acoustic wave resonator having a further enhanced Q value in comparison with the conventional surface acoustic wave resonator.

(Application 9) In the surface acoustic wave resonator, a region having a constant electrode finger pitch may be disposed at the center of the IDT.

According to this configuration, since the region having the constant electrode finger pitch is disposed at the center of the IDT, it is possible to keep the vibration displacement great at the center of the IDT, thereby enhancing an excellent Q value.

(Application 10) In the surface acoustic wave resonator, a ratio Nf/N of the number of pairs of electrode fingers Nf in the region having the constant electrode finger pitch at the center of the IDT to the number of pairs of electrode fingers N in the IDT may be in the range of 0<Nf/N<0.36.

According to this configuration, when the ratio Nf/N of the number of pairs of electrode fingers Nf in the region having the constant electrode finger pitch to the number of pairs of electrode fingers N in the IDT is set to the range of 0<Nf/N<0.36, it is possible to obtain an excellent Q value.

(Application 11) According to another aspect of the invention, there is provided a surface acoustic wave oscillator in which the above-mentioned surface acoustic wave resonator and a circuit element are mounted on a package.

According to this configuration, since the surface acoustic wave resonator having the enhanced Q value and the reduced size is mounted, it is possible to provide a surface acoustic wave oscillator having a small size.

(Application 12) According to still another aspect of the invention, there is provided a surface acoustic wave module unit in which the above-mentioned surface acoustic wave resonator is mounted on a circuit board.

According to this configuration, since the surface acoustic wave resonator having the enhanced Q value and the reduced size is mounted, it is possible to provide a surface acoustic wave module unit having a small size.

DESCRIPTION OF EMBODIMENTS

Figure 1:
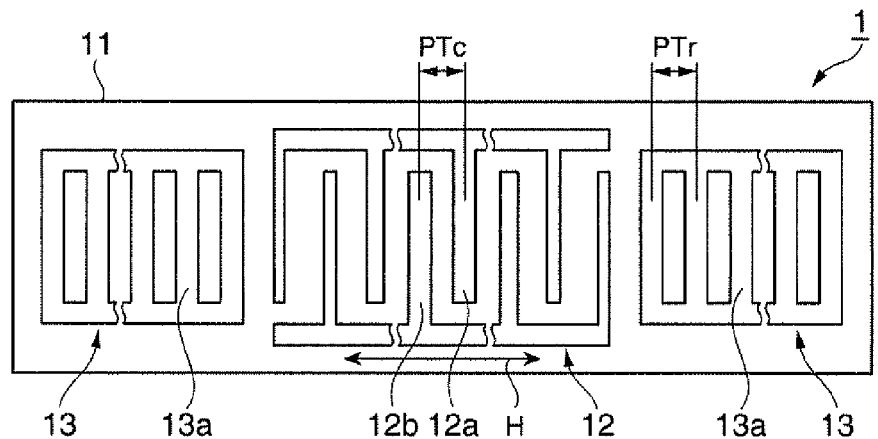
FIG. 1 is a plan view schematically illustrating the configuration of a surface acoustic wave resonator according to a first embodiment of the invention.

Hereinafter, exemplary embodiments of the invention will be described with reference to the accompanying drawings. In the drawings described below, the scale sizes of the constituent elements are appropriately changed for easier recognition of the constituent elements.

(Surface Acoustic Wave Resonator as Comparative Example)

First, a surface acoustic wave resonator as a comparative example will be described for the purpose of easier understanding of the invention and comparison with the embodiments.

Figure 21:
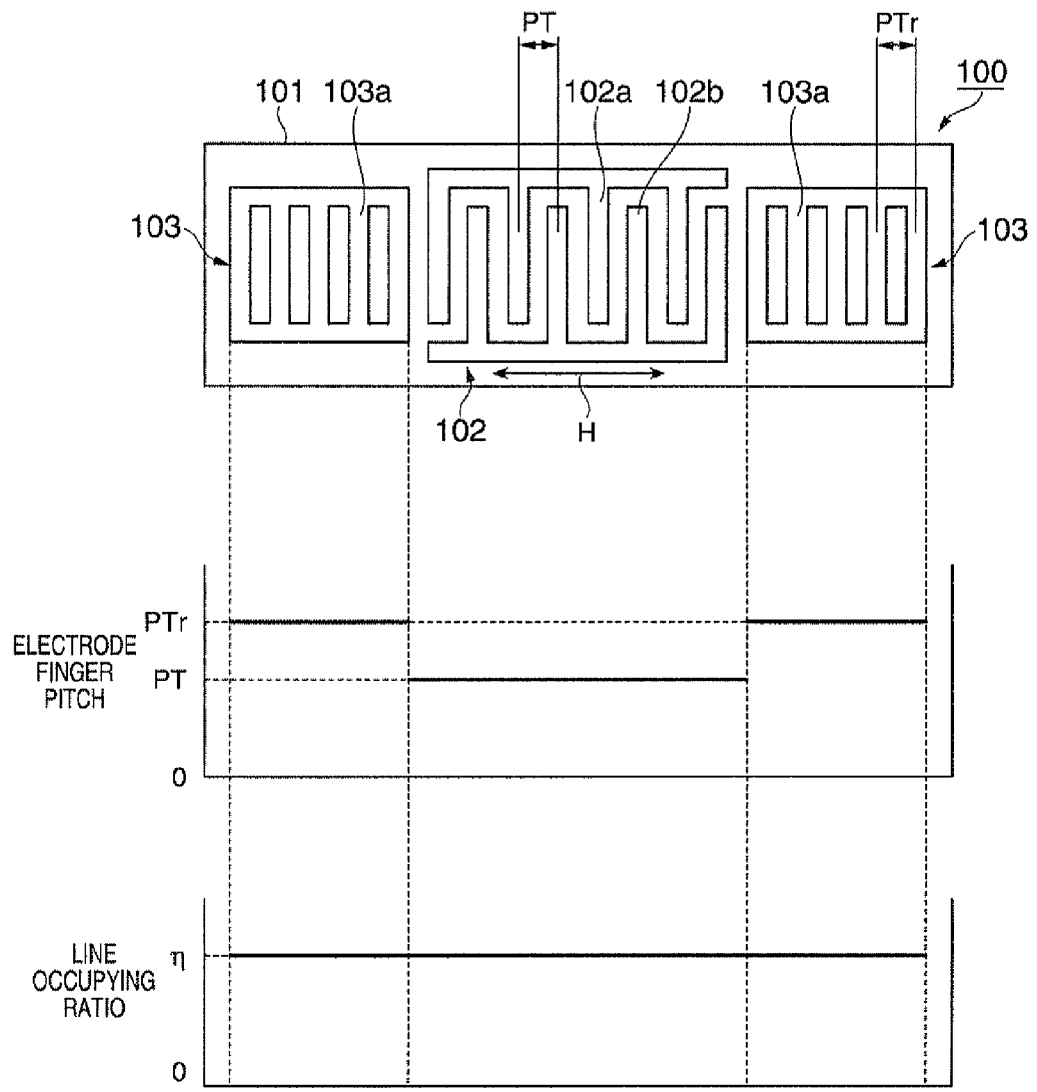
FIG. 21 is a diagram schematically illustrating a conventional surface acoustic wave resonator.

FIG. 21 is a diagram schematically illustrating a conventional surface acoustic wave resonator.

The surface acoustic wave resonator 100 includes an IDT 102 having a comb-like electrode and a pair of reflectors 103 disposed with the IDT 102 interposed therebetween in the direction (the direction of arrow H) in which surface acoustic waves travel, on a crystal substrate 101 as a piezoelectric substrate.

The crystal substrate 101 is an in-plane rotated ST-cut crystal substrate and has an Euler angle (−1° to +1°, 121° to 135°, ±(40° to 49°)) when a cut face and a surface acoustic wave traveling direction are expressed by an Euler angle ($\phi$, $\theta$, $\psi$).

In the IDT 102, electrode fingers 102a and 102b having different electrical polarities are alternately arranged. Two electrode fingers 102a and 102b are called a pair of electrode fingers.

The electrode finger pitch PT which is a distance between the centers of neighboring electrode fingers 102a and 102b is uniform in the IDT 102.

In the reflectors 103, plural electrode fingers 103a are arranged to be electrically neutral. The electrode finger pitch PTr which is a distance between the centers of neighboring electrode fingers 103a is also uniform in the reflectors 103.

Figure 22:
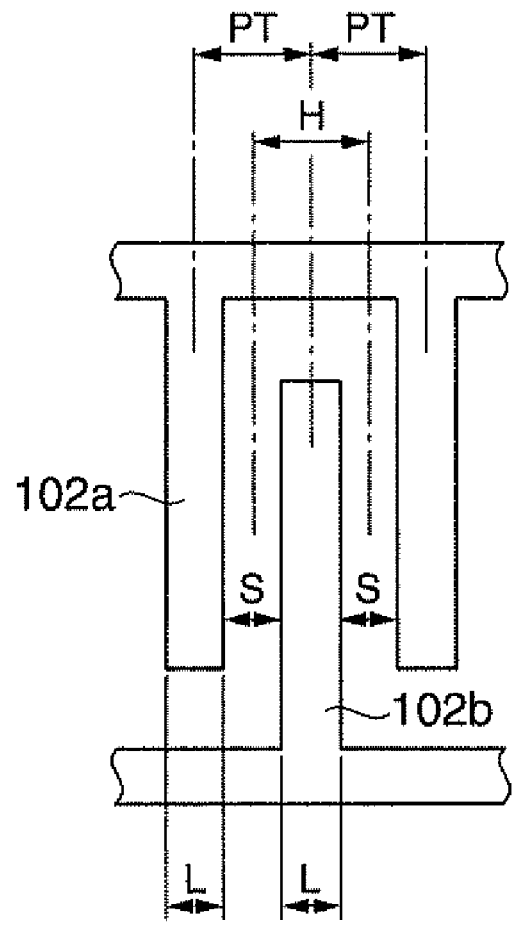
FIG. 22 is a diagram schematically illustrating the line occupying ratio.

Here, a ratio at which the electrode fingers occupy the IDT 102 and the reflectors 103 in the surface acoustic waves traveling direction is referred to as a line occupying ratio $\eta$. The line occupying ratio $\eta$ will be described in detail with reference to FIG. 22.

It is assumed that the line width of the electrode fingers 102a and 102b is L, the distance between neighboring electrode fingers (a space in which the electrode fingers are not formed) is S, and the distance between the center lines between the neighboring electrode fingers is defined as the electrode finger pitch PT. The distance between the center lines of gaps between the neighboring electrode fingers is defined as H. Then, the line occupying ratio is expressed by $\eta = L/H = L/(L+1/2(S+S)) = L/(L+S)$. In this way, since the electrode fingers having the same line width are arranged with the same electrode finger pitch, the electrode finger pitch is expressed by PT=L+S=H.

The line occupying ratio $\eta$ of the surface acoustic wave resonator 100 has the same value in the IDT 102 and the reflectors 103 and is set to $\eta=0.5$.

The IDT 102 and the reflectors 103 are formed of a metal material such as aluminum (Al) and are set to a predetermined thickness (=0.06$\lambda$, where $\lambda$ is a wavelength of the surface acoustic waves). The line width of the electrode fingers is set to 0.25$\lambda$. The number of pairs of electrode fingers in the IDT 102 is set to 136 and the number of pairs of electrode fingers in each of the reflectors 103 is set to 57 (250 pairs in total).

In such a surface acoustic wave resonator 100, Rayleigh waves are excited by the IDT 102 and the Q value as a characteristic thereof is 9,000.

(First Embodiment)

A surface acoustic wave resonator according to a first embodiment of the invention will be described below.

Figure 2:
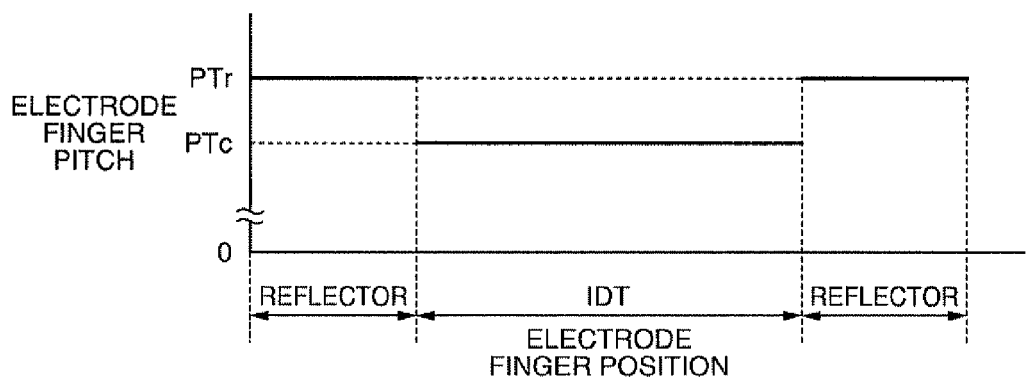
FIG. 2 is a diagram illustrating the relation between an electrode finger position and an electrode finger pitch in the surface acoustic wave resonator according to the first embodiment.
Figure 3:
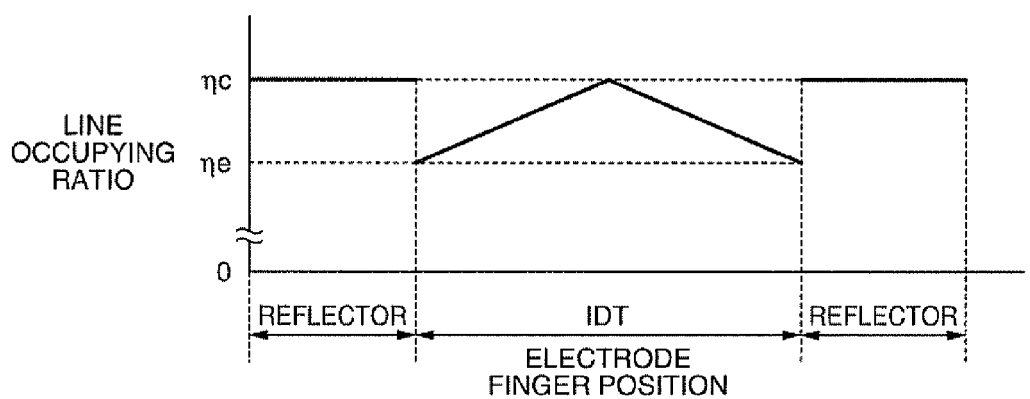
FIG. 3 is a diagram illustrating the relation between the electrode finger position and the line occupying ratio in the surface acoustic wave resonator according to the first embodiment.
Figure 4:
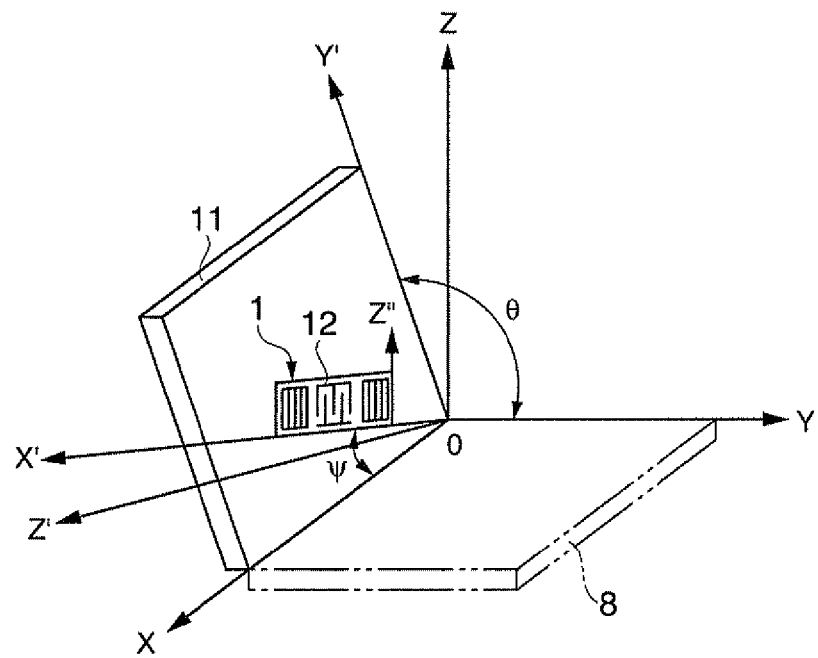
FIG. 4 is a diagram illustrating a cutout angle of a crystal substrate and a traveling direction of surface acoustic waves.
Figure 5:
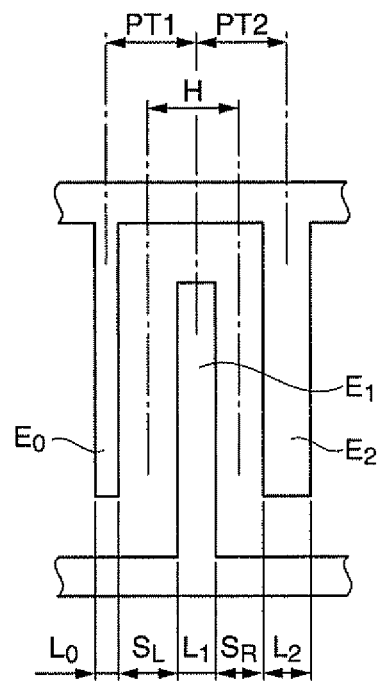
FIG. 5 is a diagram schematically illustrating the line occupying ratio.

FIG. 1 is a plan view schematically illustrating the configuration of a surface acoustic wave resonator according to this embodiment. FIG. 2 is a diagram illustrating the relation between an electrode finger position and an electrode finger pitch in the surface acoustic wave resonator according to this embodiment. FIG. 3 is a diagram illustrating the relation between the electrode finger position and a line occupying ratio in the surface acoustic wave resonator according to this embodiment. FIG. 4 is a diagram illustrating a cutout angle of a crystal substrate and a traveling direction of surface acoustic waves. FIG. 5 is a diagram schematically illustrating the line occupying ratio.

As shown in FIG. 1, the surface acoustic wave resonator 1 includes an IDT 12 having a comb-like electrode and a pair of reflectors 13 disposed with the IDT 12 interposed therebetween in the direction (the direction of arrow H) in which surface acoustic waves travel, on a crystal substrate 11 as a piezoelectric substrate.

When a cut face and a surface acoustic wave traveling direction are expressed by the Euler angle ($\phi$, $\theta$, $\psi$), the crystal substrate 11 is an in-plane rotated ST-cut crystal substrate with an Euler angle of (−1° to +1°, 113° to 135°, ±(40° to 49°)).

As shown in FIG. 4, crystal axes of the crystal are defined by an X axis (electrical axis), a Y axis (mechanical axis), and a Z axis (optical axis), and the Euler angle (0°, 0°, 0°) is a crystal Z plate 8 perpendicular to the Z axis. Here, the Euler angle $\phi$ (not shown) is involved in a first rotation of the crystal Z plate 8, and represents a first rotation angle in which the Z axis is set as a rotation axis and a rotating direction from +X axis to the +Y axis is defined as a positive rotating direction. The Euler angle $\theta$ is involved in a second rotation performed after the first rotation of the crystal Z plate 8, and represents a second rotation angle in which the X axis after the first rotation is set as a rotation axis and a rotating direction from +Y axis after the first rotation to the +Z axis is defined as a positive rotating direction. The cut face of the crystal substrate 11 is determined by the first rotation angle $\phi$ and the second rotation angle $\theta$. The Euler angle $\psi$ is involved in a third rotation performed after the second rotation of the crystal Z plate 8, and represents a third rotation angle in which the Z axis after the second rotation is set as a rotation axis and a rotating direction from +X axis after the second rotation to the +Y axis after the second rotation is defined as a positive rotating direction. The surface acoustic wave traveling direction is represented by the third rotation angle $\psi$ about the X axis after the second rotation. The surface acoustic wave resonator 1 employs the crystal substrate 11 in which the first rotation angle $\phi$ is in the range of −1° to +1° and the second rotation angle $\theta$ is in the range of 113° to 135°. The IDT 12 is disposed so that the surface acoustic wave traveling direction $\psi$ is in the range of ±(40° to 49°). The angle $\psi$ is also referred to as an in-plane rotation angle. In this crystal substrate, the variation in frequency with the variation in temperature is small and thus the frequency-temperature characteristic is excellent.

In the IDT 12, electrode fingers 12a and 12b are alternately arranged so as to have different electrical polarities. In this embodiment, two neighboring electrode fingers 12a and 12b are counted as a pair of electrodes and the number of pairs of electrode fingers in the IDT 12 is set to 136.

Here, the distance between the centers of the neighboring electrode fingers 12a and 12b is defined as an electrode finger pitch. The electrode finger pitch of the IDT 12 is PTc which is constant as shown in FIG. 2.

The ratio of the electrode fingers occupying the IDT 12 and the reflectors 13 in the surface acoustic wave traveling direction is defined as a line occupying ratio η. As shown in FIG. 5, electrode fingers $E_0$, $E_1$, and $E_2$ are arranged to neighbor each other. The line width of the electrode finger $E_1$ is represented by $L_1$ and the line widths of the electrode fingers $E_0$ and $E_2$ neighboring the electrode finger on both sides thereof are represented by $L_0$ and $L_2$.

The distance between the electrode finger $E_0$ and the electrode finger $E_1$ (the space in which no electrode finger is formed) is SL, the distance between the electrode finger $E_1$ and the electrode finger $E_2$ is SR, the electrode finger pitch between the electrode finger $E_0$ and the electrode finger $E_1$ is PT1, and the electrode finger pitch between the electrode finger $E_1$ and the electrode finger $E_2$ is PT2. The distance between the center line between the neighboring electrode fingers $E_0$ and $E_1$ and the center line between the neighboring electrode fingers $E_1$ and $E_2$ is H.

Then, the line occupying ratio η of the electrode finger $E_1$ is calculated as η=$L_1$/H=$L_1$/($L_1$+(SL/2+SR/2)).

The electrode finger pitch is calculated as PT1=SL+($L_0$+$L_1$)/2 or PT2=SR+($L_1$+$L_2$)/2. In this embodiment, the electrode finger pitch is constant and thus PT1=PT2 is established.

As shown in FIG. 3, when the line occupying ratio r at the center of the IDT 12 is ηc and the line occupying ratio η at the edge of the IDT 12 is ηe, the line occupying ratio η of the IDT 12 has a relation of ηc>ηe. The line occupying ratio varies to gradually decrease from the center to both edges of the IDT 12 from the line occupying ratio ηc to the line occupying ratio ηe.

In the reflectors 13, plural electrode fingers 13a are arranged to be electrically neutral. Here, the reflectors 13 may be grounded or may be connected to one of the electrode fingers 12a and 12b.

The electrode finger pitch which is the distance between the centers of the neighboring electrode fingers 13a is constant as PTr. The line occupying ratio of the reflectors 13 is set to the same value as the line occupying ratio at the center of the IDT 12.

In the reflectors 13, two neighboring electrode fingers 13a are counted as a pair of electrodes and 57 pairs of electrode fingers 13a are arranged on each side in this embodiment.

The IDT 12 and the reflectors 13 are formed of aluminum (Al) as a metal material and the thickness thereof is set to 0.06λ (where λ is the wavelength of a surface acoustic wave).

The electrode finger pitches are set to PTc=7.498 μm and PTr=7.574 μm and the line occupying ratios are set to ηc=0.35 and ηe=0.21.

In the surface acoustic wave resonator 1 having the above-mentioned configuration, Rayleigh waves are excited in the IDT 12 and the Q value as a characteristic thereof is 24,000.

The characteristics of the surface acoustic wave resonator according to this embodiment will be described in detail below.

Figure 6:
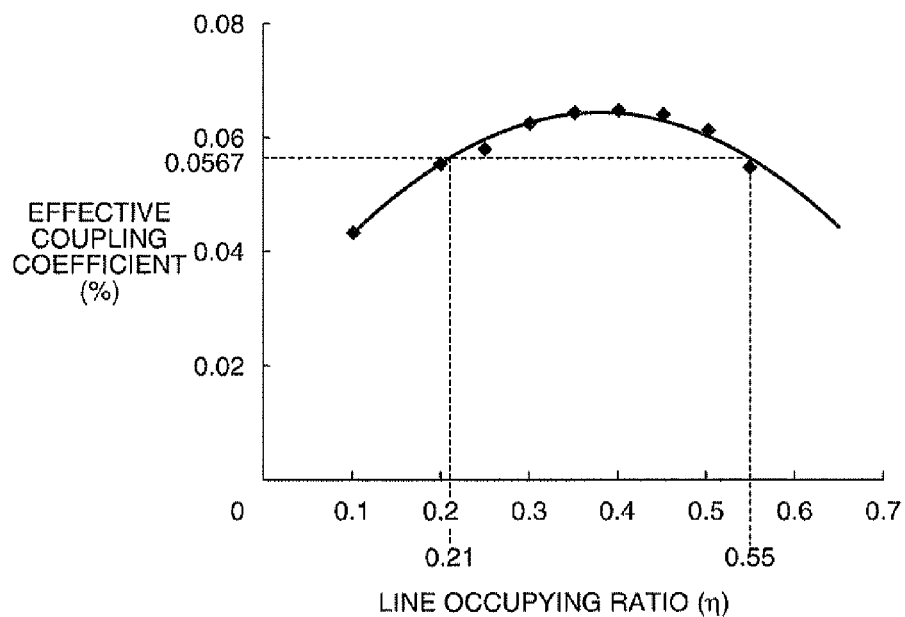
FIG. 6 is a graph illustrating the relation between the line occupying ratio and an effective coupling coefficient in an IDT according to the first embodiment.

FIG. 6 is a graph illustrating the relation between the line occupying ratio and the effective coupling coefficient in the IDT.

In the surface acoustic wave resonator, the CI value or the equivalent resistance R1 along with the Q value is an important characteristic. By lowering this characteristic, it is possible to reduce the power consumption. In order to lower the CI value or the equivalent resistance R1, it is necessary to enhance an electromechanical coupling coefficient $K^2$.

The electromechanical coupling coefficient $K^2$ can be calculated by the following expression.

$$K^2=(2(Vo-Vs)/Vo)\times 100[\%]$$

Here, Vo represents the traveling speed of the surface acoustic waves when the electrode fingers of the IDT are electrically opened and Vs represents the traveling speed of the surface acoustic waves when the electrode fingers of the IDT are electrically shorted.

The electromechanical coupling coefficient when the line occupying ratio η is changed is calculated from the normalized speed difference between the time of opening the IDT and the time of shorting the IDT and is expressed as an effective coupling coefficient.

As shown in FIG. 6, the effective coupling coefficient increases as the line occupying ratio η increases from 0.1, and the effective coupling coefficient is the maximum at about 0.4. At this time, the effective coupling coefficient is about 0.065% and the CI value or the equivalent resistance R1 is the minimum. As the line occupying ratio η further increases from 0.4, the effective coupling coefficient decreases.

When the line occupying ratio η is in the range of 0.21≦η≦0.55, the effective coupling coefficient is equal to or greater than 0.0567%, which is a practical range.

In this embodiment, the range of 0.3 to 0.5 of the line occupying ratio having a large effective coupling coefficient is selected as the line occupying ratio ηc at the center of the IDT 12.

Figure 7:
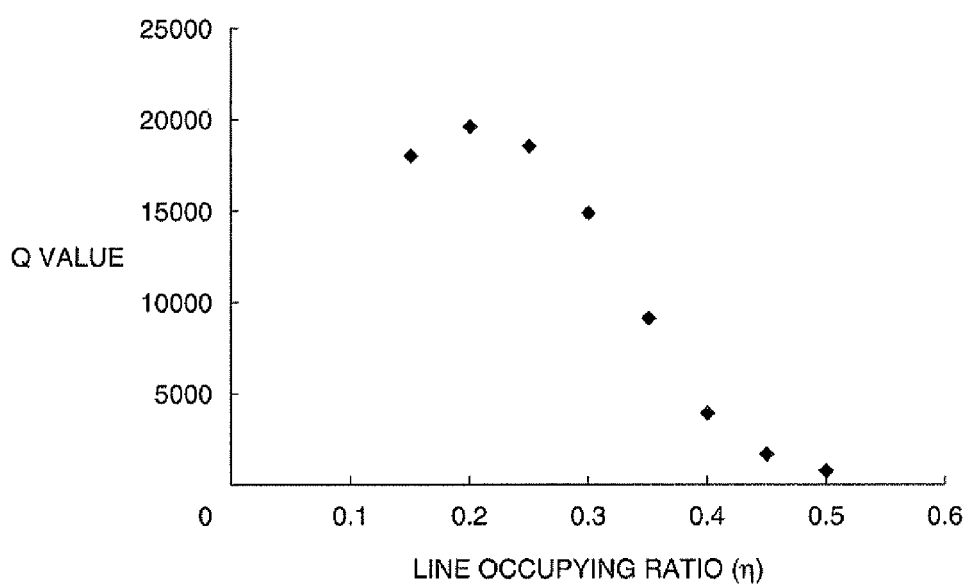
FIG. 7 is a graph illustrating the relation between the line occupying ratio and the Q value according to the first embodiment.

FIG. 7 is a graph illustrating the relation between the line occupying ratio and the Q value.

The Q value increases as the line occupying ratio η increases from 0.15 and is the maximum when the line occupying ratio η is about 0.2. At this time, the Q value is about 20,000. The Q value decreases as the line occupying ratio η further increases from 0.2.

The Q value and the reflection amount have the correlative relationship, and the inventor thus confirmed that the reflection amount is almost the maximum when the Q value is the maximum.

That is, regarding the reflection amount, the reflection of the surface acoustic waves is almost the maximum when the line occupying ratio η is about 0.2. At this time, the confinement of vibration energy in the resonator is excellent and the Q value is the maximum.

Accordingly, in the this embodiment, the range of 0.15≦ηe≦0.3 of the line occupying ratio having a large reflection amount is selected as the line occupying ratio ηe at the edges of the IDT 12.

As can be seen from FIGS. 6 and 7, in the IDT according to this embodiment, the line occupying ratio having the maximum electromechanical coupling coefficient and the line occupying ratio having the maximum Q value or reflection amount of the surface acoustic waves are different from each other. In this embodiment, the weighting is carried out with the line occupying ratio.

The line occupying ratio having a large effective coupling coefficient at the center of the IDT 12 is set to the range of 0.3 to 0.5 and the line occupying ratio at both edges of the IDT 12 is set to the range equal to or greater than 0.15 and less than 0.3 so as to enhance the reflection.

Figure 8:
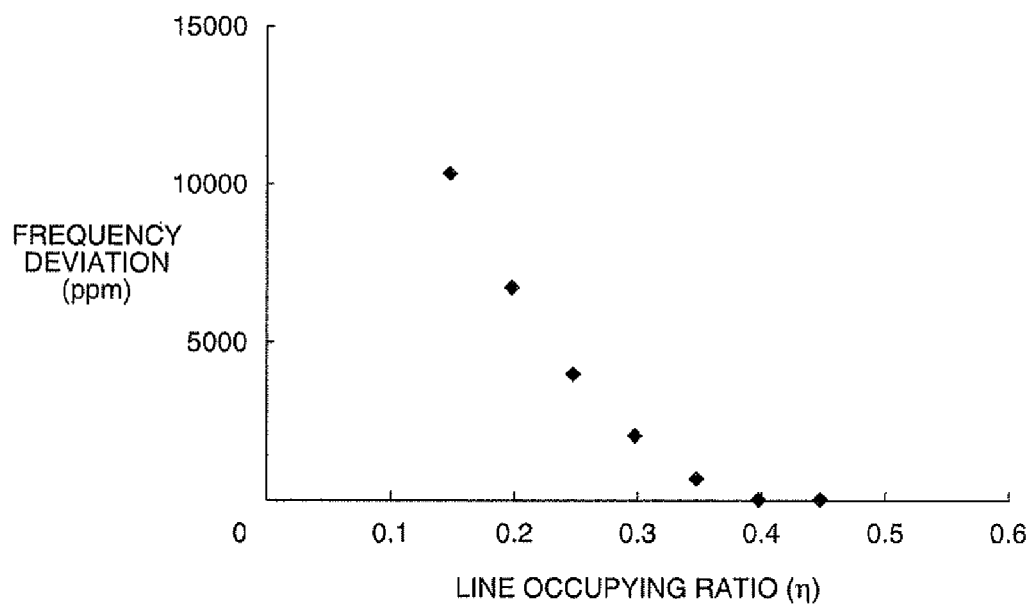
FIG. 8 is a graph illustrating the relation between the line occupying ratio and the frequency variation in the IDT according to the first embodiment.

FIG. 8 is a graph illustrating the relation between the line occupying ratio and the frequency variation in the IDT.

As shown in the drawing, the frequency variation decreases as the line occupying ratio η increases from 0.15 and the frequency variation with the variation of the line occupying ratio η is the minimum when the line occupying ratio η is about 0.4.

At the center of the IDT 12 having a large vibration displacement, the sensitivity of the frequency variation to the variation of the line occupying ratio η is high and the frequency greatly varies with the variation of the line occupying ratio η. On the other hand, at the edges of the IDT 12, the vibration displacement is small and has a small influence on the frequency of the surface acoustic wave resonator 1 even when the line occupying ratio η varies at those parts.

Accordingly, by selecting the range of the line occupying ratio η having a small frequency variation for the center of the IDT 12, it is possible to reduce the frequency variation when the line occupying ratio η varies.

In this embodiment, the line occupying ratio ηc causing a large effective coupling coefficient is set to the range of 0.3 to 0.5, which is almost the same as the line occupying ratio causing a small frequency variation.

Therefore, in this embodiment, it is possible to reduce the frequency deviation in manufacturing and thus to provide a surface acoustic wave resonator 1 with high frequency precision.

Figure 9:
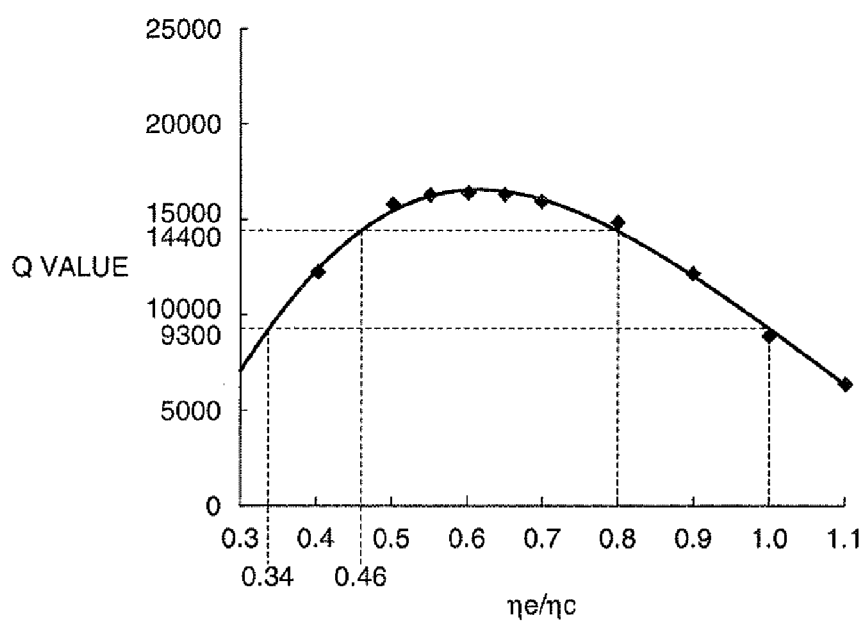
FIG. 9 is a graph illustrating the relation between ηe/ηc and the Q value according to the first embodiment.

FIG. 9 is a graph illustrating the relation between the Q value and the value (ηe/ηc) obtained by dividing the line occupying ratio ηe at the edges of the IDT by the line occupying ratio ηc at the center of the IDT.

In this graph, the line occupying ratio at the center of the IDT is set to ηc=0.35 and the line occupying ratio ηe at the edges of the IDT is made to vary in the range of 0.14 to 0.35 (ηe/ηc=0.4 to 1.0).

As can be seen from this graph, the Q value increases as ηe/ηc increases from 0.3, and the Q value is the maximum at ηe/ηc=0.6. As ηe/ηc increases from 0.6, the Q value decreases.

Since ηc=0.35 is obtained from ηe/ηc=0.6, the reflection from the edges of the IDT increases at ηe=0.21 and the Q value is the maximum. When the ratio ηe/ηc of the line occupying ratios at the center and the edges of the IDT 12 is in the range of 0.34<ηe/ηc<1.0, the Q value equal to or greater than 9,300 can be obtained. Accordingly, the Q value is enhanced more than that in the case where the weighting is not performed using the line occupying ratio (ηe/ηc=1.0).

In the range of 0.46≦ηe/ηc≦0.8, an excellent characteristic of the Q value being equal to or greater than 14,400 can be obtained.

As described above, regarding the standing waves of the surface acoustic waves generated in the surface acoustic wave resonator 1, the vibration displacement is large at the center of the IDT 12 and is small at both edges thereof. The line occupying ratio causing the increase in electromechanical coupling coefficient is selected for the center of the IDT 12 having the large vibration displacement so as to suppress an increase in CI value, and the line occupying ratio causing the increase in reflection of the surface acoustic waves is selected for both edges having the small vibration displacement so as to enhance the confinement of vibration energy in the IDT 12. Accordingly, it is possible to implement a surface acoustic wave resonator 1 with excellent CI value and Q value.

From another point of view, by selecting the line occupying ratio causing the increase in electromechanical coupling coefficient for the center of the IDT 12 having a large vibration displacement, the reflection of the surface acoustic waves from the center of the IDT 12 can decrease. By selecting the line occupying ratio causing the increase in reflection of the surface acoustic waves for both edges of the IDT 12 having a small vibration displacement, the electromechanical coupling coefficient at both edges of the IDT 12 can decrease. However, the inventor discovered that it was possible to accomplish the enhancement in Q value or the reduction in CI value of the surface acoustic wave resonator 1 by employing such a structure that the electromechanical coupling coefficient is emphasized at the center of the IDT 12 rather than the reflection of the surface acoustic waves and the reflection of the surface acoustic waves is emphasized at both edges of the IDT 12 rather than the electromechanical coupling coefficient even when the reflection of the surface acoustic waves at the center of the IDT 12 decreases and the electromechanical coupling coefficient at both edges of the IDT 12 decreases.

Accordingly, it is possible to enhance the Q value to reduce the size of the surface acoustic wave resonator 1 and to provide a surface acoustic wave resonator 1 in which the power consumption is reduced by decreasing the CI value.

Tables 1 and 2 show the Q values of the surface acoustic wave resonator when the Euler angle of the crystal substrate is variously changed. Table 1 is based on the comparative example where the line occupying ratio ηc and the line occupying ratio ηe are set to the same value so that the line occupying ratio is constant all over the IDT, and Table 2 is based on the first embodiment of the invention.

The IDT 12 and the reflectors 13 are formed of aluminum (Al) which is a metal material, and the thickness thereof is set to 0.04λ (where λ is the wavelength of surface acoustic waves).

TABLE 1

| Euler angle | | | IDT | | | | | reflector | | |
|---|---|---|---|---|---|---|---|---|---|---|
| φ [°] | θ [°] | ψ [°] | Number of pairs | Pt [μm] | ηc | ηe | ηe/ηc | Number of pairs | PTr [μm] | Q |
| −1 | 113 | 40 | 80 | 5.1743 | 0.25 | 0.25 | 1 | 25 | 5.2266 | 1767 |
|  |  | 49 |  |  |  |  |  |  |  | 2288 |
|  | 135 | 40 |  |  |  |  |  |  |  | 2246 |
|  |  | 49 |  |  |  |  |  |  |  | 3645 |
| 1 | 113 | 40 |  |  |  |  |  |  |  | 1647 |
|  |  | 49 |  |  |  |  |  |  |  | 2190 |
|  | 135 | 40 |  |  |  |  |  |  |  | 1982 |
|  |  | 49 |  |  |  |  |  |  |  | 3511 |
| 0 | 124 | 44.5 |  |  |  |  |  |  |  | 3070 |

TABLE 2

| Euler angle φ [°] | Euler angle θ [°] | Euler angle ψ [°] | IDT Number of pairs | IDT Pt [μm] | IDT ηc | IDT ηe | IDT ηe/ηc | reflector Number of pairs | reflector PTr [μm] | Q |
|---|---|---|---|---|---|---|---|---|---|---|
| −1 | 113 | 40 | 80 | 5.1743 | 0.4 | 0.25 | 0.625 | 25 | 5.2266 | 2081 |
|  |  | 49 |  |  |  |  |  |  |  | 2606 |
|  | 135 | 40 |  |  |  |  |  |  |  | 2602 |
|  |  | 49 |  |  |  |  |  |  |  | 6008 |
| 1 | 113 | 40 |  |  |  |  |  |  |  | 2043 |
|  |  | 49 |  |  |  |  |  |  |  | 2503 |
|  | 135 | 40 |  |  |  |  |  |  |  | 2074 |
|  |  | 49 |  |  |  |  |  |  |  | 5433 |
| 0 | 124 | 44.5 |  |  |  |  |  |  |  | 3852 |

Comparing Tables 1 and 2, it can be clearly seen that the surface acoustic wave resonator according to this embodiment can realize a Q value higher than that of the surface acoustic wave resonator in which the line occupying ratio is kept constant all over the IDT.

(Second Embodiment)

A surface acoustic wave resonator according to a second embodiment of the invention will be described below. Although the IDT is weighted using the line occupying ratio, but the IDT is weighted using both the line occupying ratio and the electrode finger pitch in this embodiment.

Figure 10:
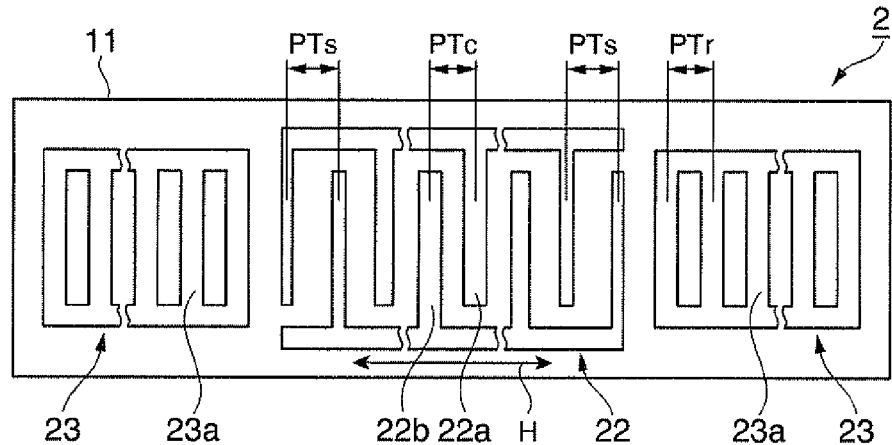
FIG. 10 is a plan view schematically illustrating the configuration of a surface acoustic wave resonator according to a second embodiment of the invention.
Figure 11:
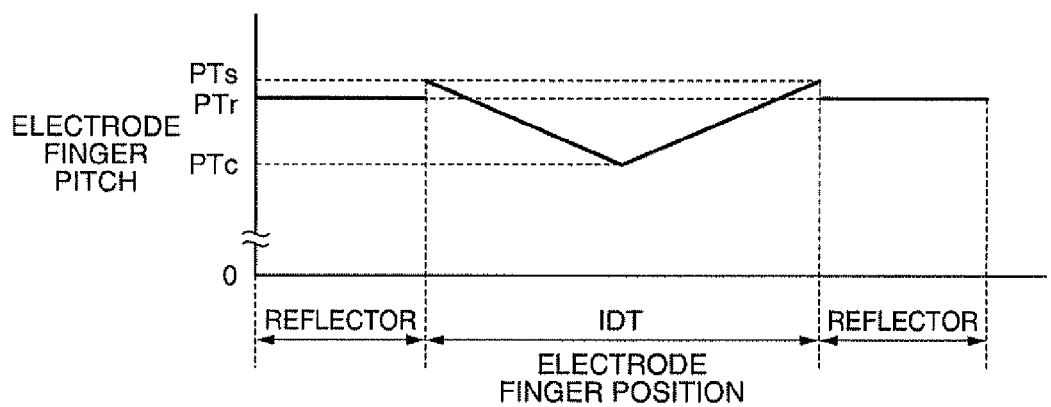
FIG. 11 is a diagram illustrating the relation between an electrode finger position and an electrode finger pitch in the surface acoustic wave resonator according to the second embodiment.
Figure 12:
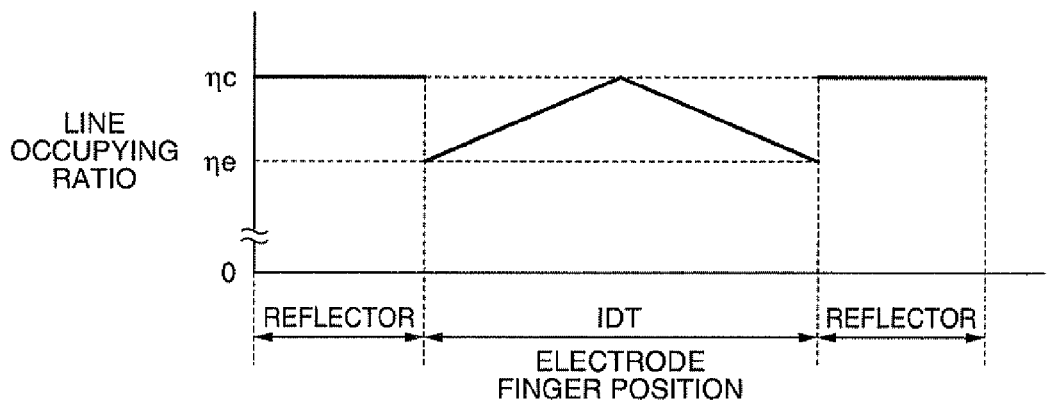
FIG. 12 is a diagram illustrating the relation between the electrode finger position and the line occupying ratio in the surface acoustic wave resonator according to the second embodiment.

FIG. 10 is a plan view schematically illustrating the configuration of a surface acoustic wave resonator according to this embodiment. FIG. 11 is a diagram illustrating the relation between the electrode finger position and the electrode finger pitch in the surface acoustic wave resonator according to this embodiment. FIG. 12 is a diagram illustrating the relation between the electrode finger position and the line occupying ratio in the surface acoustic wave resonator according to this embodiment.

As shown in FIG. 10, a surface acoustic wave resonator 2 includes an IDT 22 having a comb-like electrode and a pair of reflectors 23 disposed with the IDT 22 interposed therebetween in the direction (the direction of arrow H) in which surface acoustic waves travel, on a crystal substrate 11.

When the cut face and the surface acoustic wave traveling direction are expressed by the Euler angle (φ, θ, ψ), the crystal substrate 11 is a crystal substrate with the Euler angle of (−1° to +1°, 113° to 135°, ±(40° to 49°)).

In the IDT 22, electrode fingers 22a and 22b are alternately arranged so as to have different electrical polarities. In this embodiment, two neighboring electrode fingers 22a and 22b are counted as a pair and the number of pairs of electrode fingers in the IDT 22 is set to 136.

Here, the distance between the centers of the neighboring electrode fingers 22a and 22b is defined as the electrode finger pitch. When the electrode finger pitch at the center of the IDT 22 is PTc and the electrode finger pitch at the edges of the IDT 22 is PTs, a relation PTc<PTs is established. As shown in FIG. 11, the electrode finger pitch is changed to gradually increase from the center of the IDT 22 to both edges of the IDT 22.

Here, the ratio at which the electrode fingers occupy the IDT 22 and the reflectors 23 in the surface acoustic waves traveling direction is defined as a line occupying ratio η. Specifically, as described above with reference to FIG. 5, the line occupying ratio η is $\eta = L_1/H = L_1/(L_1+(S_L/2+S_R/2))$.

The line occupying ratio η of the IDT 22 has a relation of ηc>ηe, where ηc represents the line occupying ratio η at the center of the IDT 22 and ηe represents the line occupying ratio η at the edges of the IDT 22. As shown in FIG. 12, the line occupying ratio is changed to gradually decrease from the line occupying ratio ηc at the center to the line occupying ratio at both edges of the IDT 22.

In the reflectors 23, plural electrode fingers 23a are arranged to be electrically neutral. Here, the reflectors 23 may be grounded or may be connected to one of the electrode fingers 22a and 22b.

The electrode finger pitch which is the distance between the centers of the neighboring electrode fingers 23a is constant as PTr. The line occupying ratio of the reflectors 23 is set to the same value as the line occupying ratio ηc at the center of the IDT 22.

In the reflectors 23, two neighboring electrode fingers 23a are counted as a pair of electrodes and 57 pairs of electrode fingers 23a are arranged on each side in this embodiment.

The IDT 22 and the reflectors 23 are formed of aluminum (Al) as a metal material and the thickness thereof is set to 0.06λ (where λ is the wavelength of a surface acoustic wave).

The electrode finger pitches are set to PT=7.498 μm, PTs=7.618 μm, and PTr=7.574 μm.

The line occupying ratios are set to ηc=0.35 and ηe=0.21.

In the surface acoustic wave resonator 2 having the above-mentioned configuration, Rayleigh waves are excited in the IDT 22 and the Q value as a characteristic thereof is 24,000.

Figure 13:
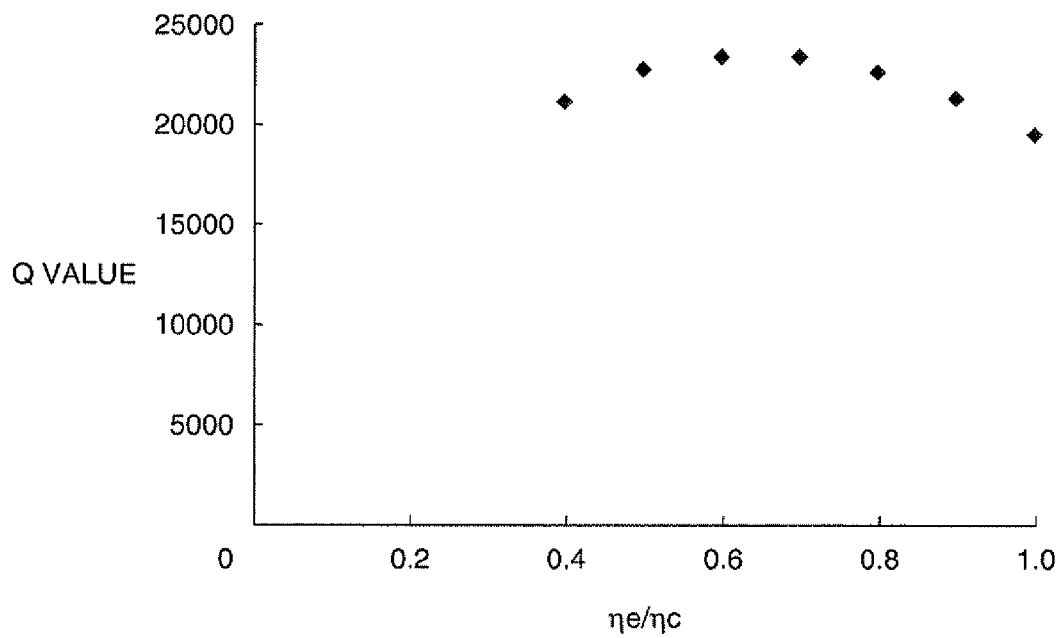
FIG. 13 is a graph illustrating the relation between ηe/ηc and the Q value according to the second embodiment.

FIG. 13 is a graph illustrating the relation between the Q value and the value (ηe/ηc) obtained by dividing the line occupying ratio ηe at the edges of the IDT by the line occupying ratio ηc at the center of the IDT.

This graph shows the variation of the Q value when the ratio of the electrode finger pitch PTs at the edges of the IDT to the electrode finger pitch PTc at the center is set to PTs/PTc=1.016, the electrode finger pitch weighting is carried out so as to gradually change the electrode finger pitch between the center of the IDT and the edges, and the line occupying ratio weighting is also carried out by changing ηe/ηc. The line occupying ratio at the center of the IDT is set to ηc=0.35 and the line occupying ratio ηe at the edges of the IDT is made to vary in the range of 0.14 to 0.35 (ηe/ηc=0.4 to 1.0).

As can be seen from this graph, the Q value increases as ηe/ηc increases from 0.4, and the Q value is the maximum at ηe/ηc=0.6. As ηe/ηc increases from 0.6, the Q value decreases.

Since ηc=0.35 is obtained from ηe/ηc=0.6, the reflection from the edges of the IDT increases at ηe=0.21 and the Q value is the maximum. When the ratio ηe/ηc of the line occupying ratios at the center and the edges of the IDT is in the range of 0.4≦ηe/ηc<1.0, the Q value equal to or greater than 20,000 can be obtained.

When the electrode finger pitch weight is not carried out (PTs/PTc=1.0) but the line occupying ratio weighting is carried out ($\eta e/\eta c<1.0$), the frequency at the edges of the IDT increases and the confinement of vibration energy of the surface acoustic waves deteriorates. However, when the electrode finger pitch weighting is carried out together, the frequency at the edges of the IDT decreases and the confinement of vibration energy of the surface acoustic waves is sufficiently improved, thereby enhancing the Q value.

Figure 14:
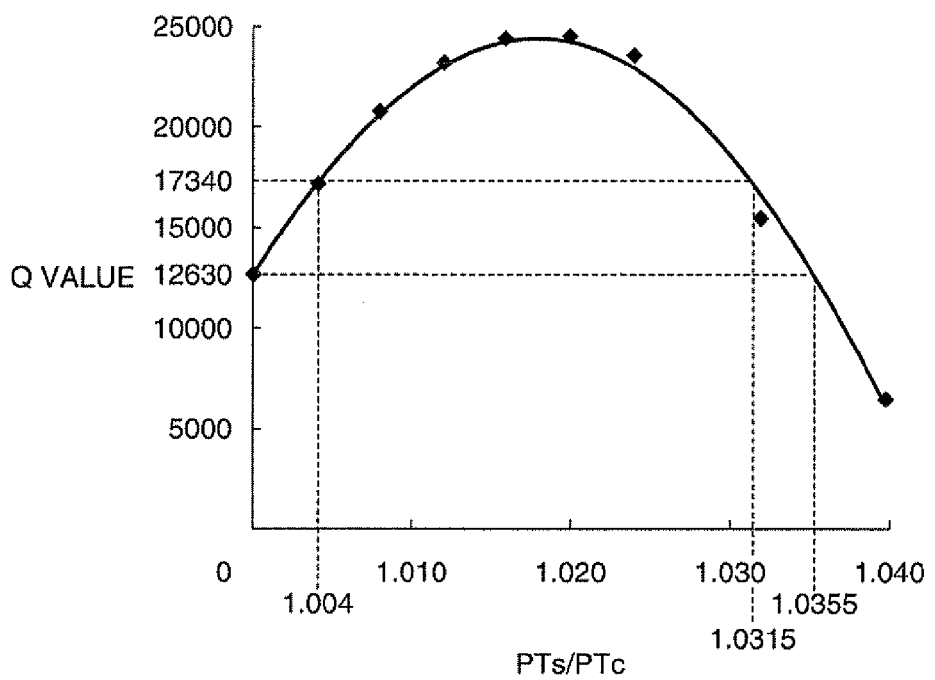
FIG. 14 is a graph illustrating the relation between PTs/PTc and the Q value according to the second embodiment.

FIG. 14 is a graph illustrating the relation between the Q value and the electrode finger pitch shift amount (PTs/PTc) which is a value obtained by dividing the electrode finger pitch PTs at the edges of the IDT by the electrode finger pitch PTc at the center.

This graph shows the variation of the Q value when the ratio $\eta e/\eta c$ of the line occupying ratio $\eta e$ at the edges of the IDT to the line occupying ratio $\eta c$ at the center is set to $\eta e/\eta c=0.6$, the line occupying ratio weighting is also carried out so as to gradually change the line occupying ratio between the center of the IDT and the edges, and the electrode finger pitch weighting is also carried out by changing PTs/PTc.

As can be seen from this graph, the Q value increases as PTs/PTc increases from 1.0, and the Q value is the maximum at PTs/PTc=1.016. As PTs/PTc increases from 1.016, the Q value decreases.

At PTs/PTc=1.0 where the electrode finger pitch weighting is not carried out, the Q value is 12,630. In the range of 1.0<PTs/PTc<1.0355, the electrode finger pitch weighting is advantageous and the Q value increases.

In the range of $1.004 \leq PTs/PTc \leq 1.0315$, an excellent characteristic that the Q value is equal to or greater than 17,340 can be obtained.

In this way, by weighting the IDT using the line occupying ratio and the electrode finger pitch, it is possible to implement a surface acoustic wave resonator 2 with an excellent Q value.

Accordingly, it is possible to enhance the Q value to reduce the size of the surface acoustic wave resonator 2.

(Third Embodiment)

A surface acoustic wave resonator according to a third embodiment of the invention will be described below. In this embodiment, the IDT is weighted using the line occupying ratio and the electrode finger pitch and a region having a constant electrode finger pitch is disposed at the center of the IDT.

Figure 15:
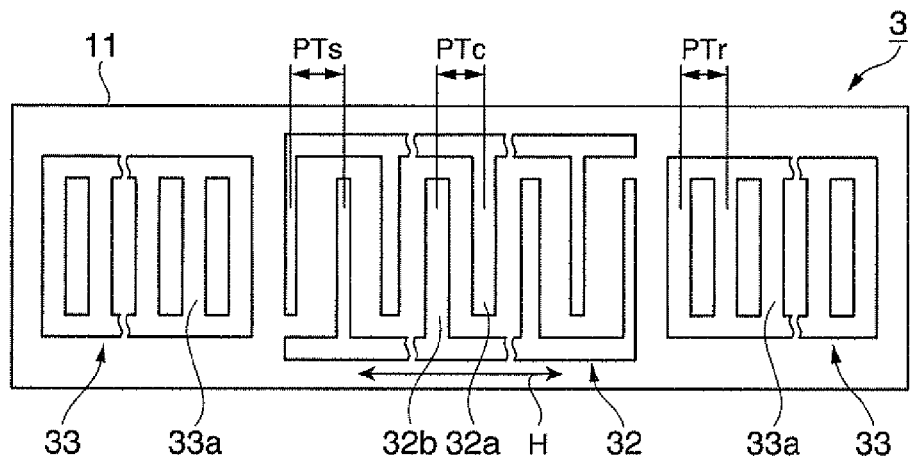
FIG. 15 is a plan view schematically illustrating the configuration of a surface acoustic wave resonator according to a third embodiment of the invention.
Figure 16:
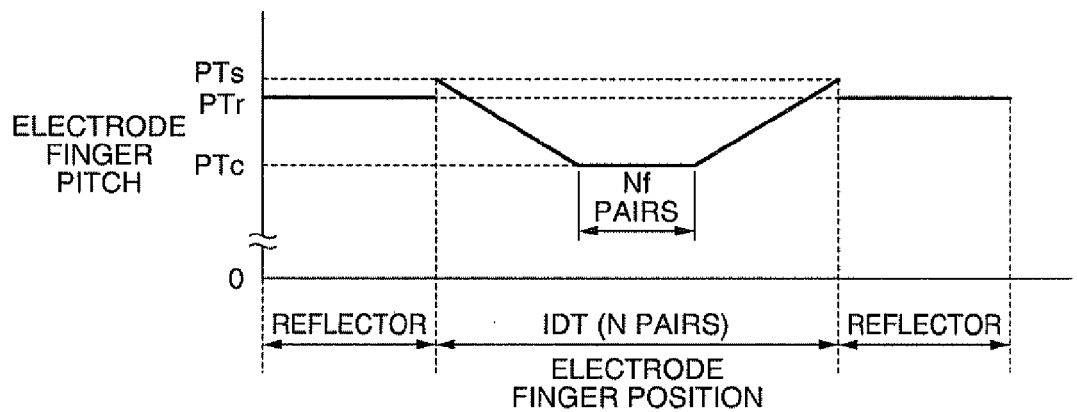
FIG. 16 is a diagram illustrating the relation between an electrode finger position and an electrode finger pitch in the surface acoustic wave resonator according to the third embodiment.
Figure 17:
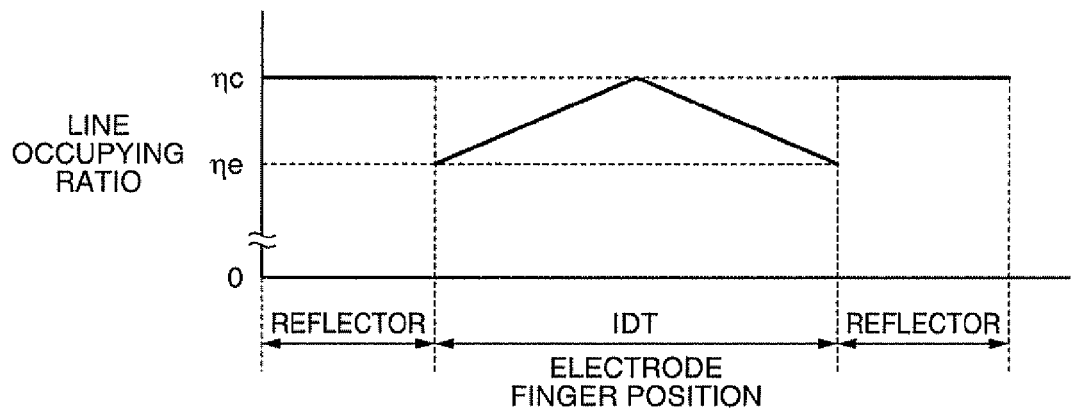
FIG. 17 is a diagram illustrating the relation between the electrode finger position and the line occupying ratio in the surface acoustic wave resonator according to the third embodiment.

FIG. 15 is a plan view schematically illustrating the configuration of a surface acoustic wave resonator according to this embodiment. FIG. 16 is a diagram illustrating the relation between the electrode finger position and the electrode finger pitch in the surface acoustic wave resonator according to this embodiment. FIG. 17 is a diagram illustrating the relation between the electrode finger position and the line occupying ratio in the surface acoustic wave resonator according to this embodiment.

As shown in FIG. 15, a surface acoustic wave resonator 3 includes an IDT 32 having a comb-like electrode and a pair of reflectors 33 disposed with the IDT 32 interposed therebetween in the direction (the direction of arrow H) in which surface acoustic waves travel, on a crystal substrate 11.

When the cut face and the surface acoustic wave traveling direction are expressed by the Euler angle ($\phi, \theta, \psi$), the crystal substrate 11 is a crystal substrate with the Euler angle of ($-1°$ to $+1°$, 113° to 135°, ±(40° to 49°)).

In the IDT 32, electrode fingers 32a and 32b are alternately arranged so as to have different electrical polarities. In this embodiment, two neighboring electrode fingers 32a and 32b are counted as a pair and the number of pairs of electrode fingers in the IDT 32 is set to 136.

Here, the distance between the centers of the neighboring electrode fingers 32a and 32b is defined as the electrode finger pitch. As shown in FIG. 16, a region having a constant electrode finger pitch is disposed at the center of the IDT 32 and the electrode finger pitch is changed to gradually increase to both edges of the IDT 32. When the electrode finger pitch at the center of the IDT 32 is PTc and the electrode finger pitch at the edges of the IDT 32 is PTs, a relation PTc<PTs is established.

Here, the ratio at which the electrode fingers occupy the IDT 32 and the reflectors 33 in the surface acoustic waves traveling direction is defined as a line occupying ratio $\eta$. Specifically, as described above with reference to FIG. 5, the line occupying ratio $\eta$ is $\eta=L_1/H=L_1/(L_1+(S_L/2+S_R/2))$.

The line occupying ratio $\eta$ of the IDT 32 has a relation of $\eta c > \eta e$, where $\eta c$ represents the line occupying ratio $\eta$ at the center of the IDT 32 and $\eta e$ represents the line occupying ratio $\eta$ at the edges of the IDT 32. As shown in FIG. 17, the line occupying ratio is changed to gradually decrease from the line occupying ratio $\eta c$ at the center to the line occupying ratio at both edges of the IDT 32.

In the reflectors 33, plural electrode fingers 33a are arranged to be electrically neutral. Here, the reflectors 33 may be grounded or may be connected to one of the electrode fingers 32a and 32b.

The electrode finger pitch which is the distance between the centers of the neighboring electrode fingers 33a is constant as PTr. The line occupying ratio of the reflectors 33 is set to the same value as the line occupying ratio at the center of the IDT 32.

In the reflectors 33, two neighboring electrode fingers 33a are counted as a pair of electrode fingers and 57 pairs of electrode fingers 33a are arranged on each side in this embodiment.

The IDT 32 and the reflectors 33 are formed of aluminum (Al) as a metal material and the thickness thereof is set to $0.06\lambda$ (where $\lambda$ is the wavelength of a surface acoustic wave).

The electrode finger pitches are set to PTc=7.498 μm, PTs=7.618 μm, and PTr=7.574 μm.

The line occupying ratios are set to $\eta c=0.35$ and $\eta e=0.21$.

In the surface acoustic wave resonator 3 having the above-mentioned configuration, Rayleigh waves are excited in the IDT 32 and the Q value as a characteristic thereof is 24,400.

Figure 18:
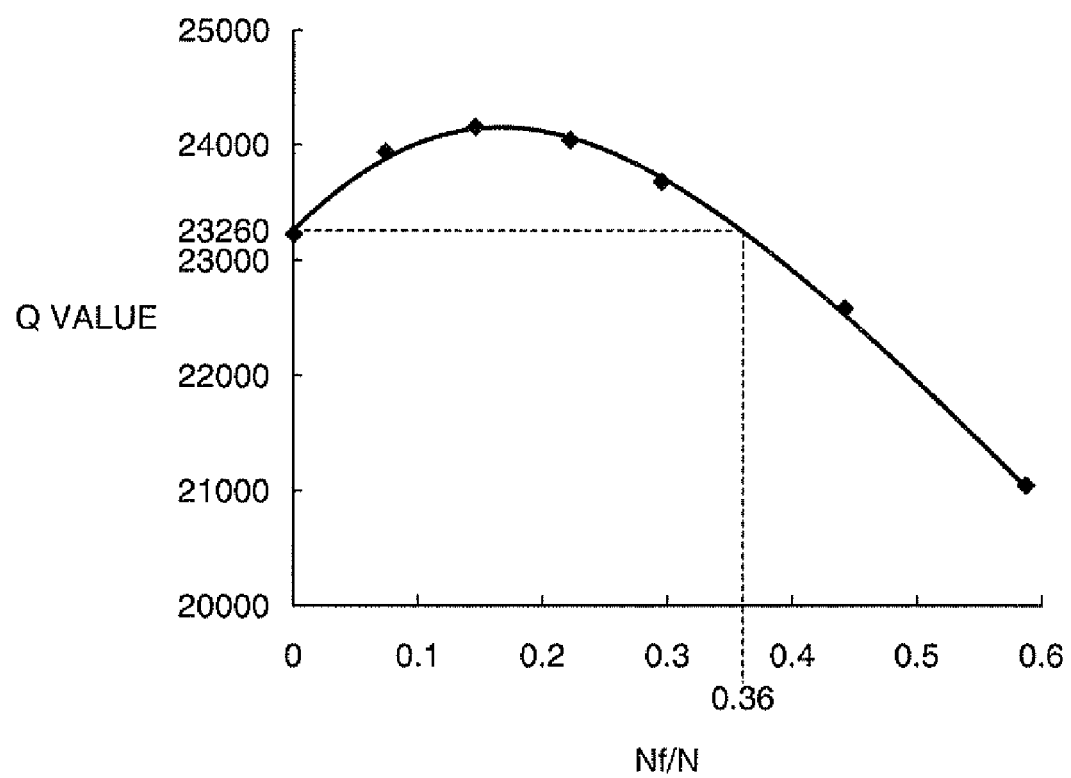
FIG. 18 is a graph illustrating the relation between Nf/N and the Q value according to the third embodiment.

FIG. 18 is a graph illustrating the relation between the Q value and the value (Nf/N) obtained by dividing the number of pairs of electrode fingers Nf in the region having the constant line occupying ratio by the total number of pairs of electrode fingers N in the IDT.

As can be seen from this graph, the Q value increases as Nf/N increases from 0 and the Q value is the maximum when Nf/N is about 0.15. As Nf/N increases from 0.15, the Q value decreases.

At Nf/N=0 where the region having the constant line occupying ratio is not disposed at the center of the IDT, the Q value is 23,260. In the range of 0<Nf/N<0.36, the region having the constant line occupying ratio is advantageous and the Q value increases.

In this way, by weighting the IDT using the line occupying ratio and the electrode finger pitch and forming the region having the constant line occupying ratio at the center of the IDT, it is possible to implement a surface acoustic wave resonator 3 with an excellent Q value.

Accordingly, it is possible to enhance the Q value, thereby reducing the size of the surface acoustic wave resonator 3.

In the first, second, and third embodiments, aluminum (Al) is used as the electrode material of the IDT and the reflectors, but the same advantages can be obtained from an aluminum alloy. Examples of the electrode material other than aluminum include gold (Au), silver (Ag), copper (Cu), tungsten (W), tantalum (Ta), and alloys containing any thereof as a main component.

Although it has been described in the first, second, and third embodiments that the electrode thickness of the IDT is set to $0.06\lambda$ (where $\lambda$ is the wavelength of the surface acoustic waves), it has been confirmed that the same advantages can be obtained with an electrode thickness other than $0.06\lambda$.

Although it has been described in the first, second, and third embodiments that the line occupying ratio in the reflectors is set to the same as the line occupying ratio at the center of the IDT, the invention is not limited to this configuration and the line occupying ratio in the reflectors may be set to be different from the line occupying ratio at the center of the IDT. The line occupying ratio in the reflectors may be set to the same as the line occupying ratio $\eta e$ at the edges of the IDT.

Although it has been described in the first, second, and third embodiments that the reflectors disposed on the IDT each have the same number of pairs of electrode fingers, the left and right reflectors may have different numbers of pairs of electrode fingers.

Although it has been described in the first, second, and third embodiment that the reflectors are disposed on both sides of the IDT, the same advantages can be obtained without employing the reflectors.

(Fourth Embodiment)

A surface acoustic wave oscillator in which the above-mentioned surface acoustic wave resonator is mounted on a package may be constructed.

Figure 19:
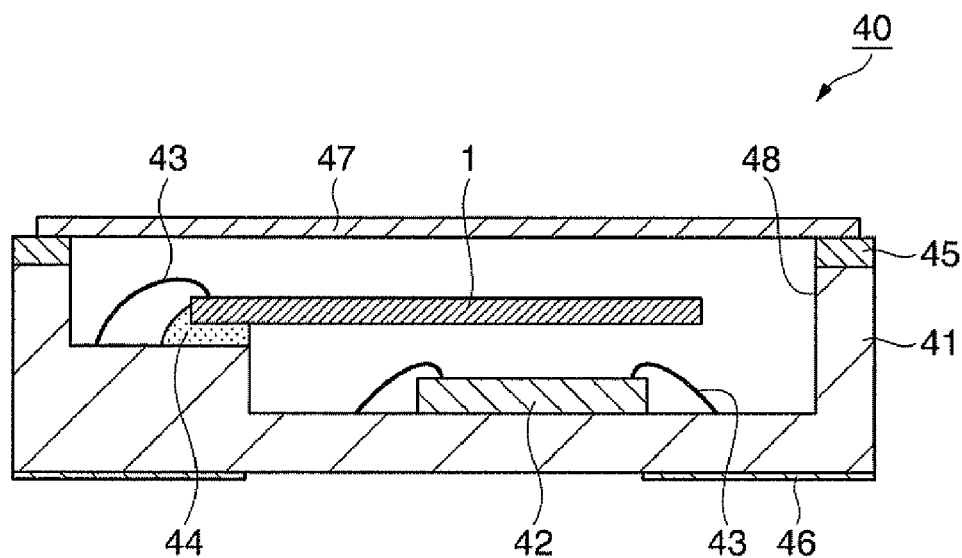
FIG. 19 is a sectional view schematically illustrating a surface acoustic wave oscillator according to a fourth embodiment of the invention.

FIG. 19 is a sectional view schematically illustrating a surface acoustic wave oscillator in which a surface acoustic wave resonator is mounted on a package.

The surface acoustic wave oscillator 40 includes a ceramic package 41, an IC chip 42, a surface acoustic wave resonator 1, and a lid member 47.

The ceramic package 41 includes a concave section 48 formed by stacking and then opening ceramic sheets. A seam ring 45 formed of a metal material such as cobalt to surround the opening is disposed in the ceramic package 41. An external connection electrode 46 for connection to an external device such as a circuit board is formed on the outer circumference of the ceramic package 41. Although not shown, an interconnection connecting the external connection electrode 46 to the concave section 48 of the ceramic package 41 is provided.

The IC chip 42 as a circuit element is fixed to the bottom surface of the concave section 48 of the ceramic package 41 and is mounted thereon via a metal wire such as a gold wire. The IC chip 42 includes an oscillation circuit exciting the surface acoustic wave resonator 1 and may further include a temperature compensating circuit and a voltage control circuit. The surface acoustic wave resonator 1 is fixed to a platform portion of the concave section 48 of the ceramic package 41 with an adhesive 44. A pad is connected to the IDT with a metal wire 43.

The lid member 47 formed of a metal material such as cobalt is disposed above the concave section 48 of the ceramic package 41. The inside of the concave section 48 of the ceramic package 41 is air-tightly sealed by seam-welding the seam ring 45 to the lid member 47.

In this way, since the surface acoustic wave resonator 1 with an increased Q value and a decreased CI value is mounted on the ceramic package 41, it is possible to provide a surface acoustic wave oscillator 40 in which the excitation of surface acoustic waves is stabilized and the power consumption is lowered.

(Fifth Embodiment)

A surface acoustic wave module unit mounted with the surface acoustic wave resonator can be constructed.

Figure 20:
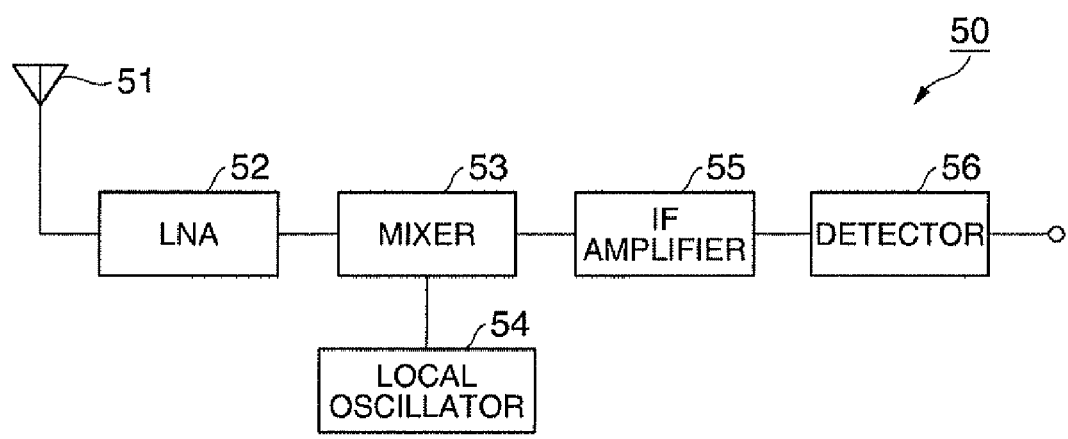
FIG. 20 is a circuit block diagram illustrating a receiver module mounted with a surface acoustic wave resonator according to a fifth embodiment of the invention.

FIG. 20 is a circuit block diagram illustrating an example of a surface acoustic wave module unit in which the surface acoustic wave resonator is mounted on a circuit board to form a receiver module.

The receiver module 50 includes a receiver antenna 51, a low noise amplifier (LNA) 52, a mixer 53, a local oscillator 54, an intermediate frequency (IF) amplifier 55, and a detector 56.

The receiver antenna 51 is connected to an input of the mixer 53 via the LNA 52. The local oscillator 54 is also connected to the input of the mixer 53. The local oscillator includes a surface acoustic wave resonator and an oscillation circuit exciting the surface acoustic wave resonator. Accordingly, the local oscillator 54 can satisfactorily output a frequency signal to the mixer 53. The IF amplifier 55 and the detector 56 are connected in series to the output of the mixer 53.

A signal transmitted from a transmitter as the opposite party is input to the LNA 52 via the receiver antenna 51, is amplified by the LNA 52, and is then input to the mixer 53. The mixer 53 receives the frequency signal from the local oscillator 54 and down-converts and outputs the signal input from the LNA 52. The down-converted signal is amplified by the IF amplifier 55 and then is input to and detected by the detector 56. By employing this configuration, the receiver module 50 can receive the signal transmitted from the transmitter. Since the receiver module 50 includes the surface acoustic wave resonator disposed in the local oscillator 54, it is possible to provide a receiver module 50 which can stably receive a signal and has low power consumption.

The receiver module may be mounted on an outer package and the like to form an electronic apparatus.

This application claims the benefit of Japanese Patent Application No. 2008-273973 filed Oct. 24, 2008 and PCT International Application No. PCT/JP2009/005541 filed Oct. 22, 2009, which are hereby incorporated by reference herein in their entirety.

REFERENCE SIGNS LIST

| | |
|---|---|
| 1, 2, 3: | SURFACE ACOUSTIC WAVE RESONATOR |
| 8: | CRYSTAL Z-PLATE |
| 11: | CRYSTAL SUBSTRATE |
| 12: | IDT |
| 12a, 12b: | ELECTRODE FINGER OF IDT |
| 13: | REFLECTOR |
| 13a: | ELECTRODE FINGER OF REFLECTOR |
| 22: | IDT |
| 22a, 22b: | ELECTRODE FINGER OF IDT |
| 23: | REFLECTOR |
| 23a: | ELECTRODE FINGER OF REFLECTOR |
| 32: | IDT |
| 32a, 32b: | ELECTRODE FINGER OF IDT |
| 33: | REFLECTOR |
| 33a: | ELECTRODE FINGER OF REFLECTOR |
| 40: | SURFACE ACOUSTIC WAVE OSCILLATOR |
| 41: | CERAMIC PACKAGE |
| 42: | IC CHIP |
| 43: | METAL WIRE |
| 44: | ADHESIVE |
| 45: | SEAM RING |
| 46: | EXTERNAL CONNECTION ELECTRODE |
| 47: | LID MEMBER |
| 50: | RECEIVER MODULE |
| 51: | RECEIVER ANTENNA |

| | |
|---|---|
| 52: | LOW NOISE AMPLIFIER (LNA) |
| 53: | MIXER |
| 54: | LOCAL OSCILLATOR |
| 55: | INTERMEDIATE FREQUENCY (IF) AMPLIFIER |
| 56: | DETECTOR |

The invention claimed is:

1. A surface acoustic wave resonator in which an IDT including electrode fingers for exciting surface acoustic waves is disposed on a piezoelectric substrate,
 wherein a line occupying ratio is defined as a value obtained by dividing the width of one electrode finger of the electrode fingers by the distance between a center line of a gap between the one electrode finger and the electrode finger adjacent to one side thereof and a center line of a gap between the one electrode finger and the electrode finger adjacent to the other side thereof,
 wherein the line occupying ratio causing the maximum electromechanical coupling coefficient and the line occupying ratio causing the maximum reflection of the surface acoustic waves in the IDT are different from each other,
 wherein the center of the IDT has the line occupying ratio causing an increase electromechanical coupling coefficient in comparison with the edges of the IDT,
 wherein the edges of the IDT have the line occupying ratio causing an increase in reflection of the surface acoustic waves in comparison with the center of the IDT,
 wherein an electrode finger pitch which is the distance between the centers of the neighboring electrode fingers in the IDT gradually increases from the center of the IDT to both edges thereof, and
 wherein a ratio PTs/PT of the electrode finger pitch PTs at the edges of the IDT to the electrode finger pitch PT at the center of the IDT is in the range of $1 < PTs/PT < 1.0355$.

2. The surface acoustic wave resonator according to claim 1, wherein the line occupying ratio is gradually changed from the center of the IDT to the edges of the IDT.

3. The surface acoustic wave resonator according to claim 1, wherein the piezoelectric substrate is a crystal substrate with an Euler angle ($-1°$ to $+1°$, $113°$ to $135°$, $\pm(40°$ to $49°)$),
 wherein the line occupying ratio $\eta c$ at the center of the IDT is in the range of $0.3 \leq \eta c \leq 0.5$, and
 wherein the line occupying ratio $\eta e$ at the edges of the IDT is in the range of $0.15 \leq \eta e \leq 0.3$.

4. The surface acoustic wave resonator according to claim 3, wherein a ratio $\eta e / \eta c$ of the line occupying ratio $\eta e$ at the edges of the IDT to the line occupying ratio $\eta c$ at the center of the IDT is in the range of $0.34 < \eta e / \eta c < 1.0$.

5. The surface acoustic wave resonator according to claim 4, wherein the ratio $\eta e / \eta c$ of the line occupying ratio $\eta e$ at the edge of the IDT to the line occupying ratio $\eta c$ at the center of the IDT is in the range of $0.46 \leq \eta e / \eta c \leq 0.8$.

6. The surface acoustic wave resonator according to claim 1, wherein the ratio PTs/PT of the electrode finger pitch PTs at the edges of the IDT to the electrode finger pitch PT at the center of the IDT is in the range of $1.004 \leq PTs/PT \leq 1.0315$.

7. The surface acoustic wave resonator according to claim 1, wherein a region having a constant electrode finger pitch is disposed at the center of the IDT.

8. The surface acoustic wave resonator according to claim 7, wherein a ratio Nf/N of the number of pairs of electrode fingers Nf in the region having the constant electrode finger pitch at the center of the IDT to the number of pairs of electrode fingers N in the IDT is in the range of $0 < Nf/N < 0.36$.

9. A surface acoustic wave oscillator in which the surface acoustic wave resonator according to claim 1 and a circuit element are mounted on a package.

10. A surface acoustic wave module unit in which the surface acoustic wave resonator according to claim 1 is mounted on a circuit board.

11. The surface acoustic wave resonator according to claim 2, wherein the piezoelectric substrate is a crystal substrate with an Euler angle ($-1°$ to $+1°$, $113°$ to $135°$, $\pm(40°$ to $49°)$),
 wherein the line occupying ratio $\eta c$ at the center of the IDT is in the range of $0.3 \leq \eta c \leq 0.5$, and
 wherein the line occupying ratio $\eta e$ at the edges of the IDT is in the range of $0.15 \leq \eta e \leq 0.3$.

12. The surface acoustic wave resonator according to claim 2, wherein an electrode finger pitch which is the distance between the centers of the neighboring electrode fingers in the IDT gradually increases from the center of the IDT to both edges thereof.

13. A surface acoustic wave oscillator in which the surface acoustic wave resonator according to claim 2 and a circuit element are mounted on a package.

14. A surface acoustic wave module unit in which the surface acoustic wave resonator according to claim 2 is mounted on a circuit board.

* * * * *